(12) United States Patent
Kang (10) Patent No.: US 7,511,987 B2
(45) Date of Patent: *Mar. 31, 2009

(54) MEMORY DEVICE WITH HIERARCHY BIT LINE

(75) Inventor: Hee Bok Kang, Daejeon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 73 days.

This patent is subject to a terminal disclaimer.

(21) Appl. No.: 11/677,633

(22) Filed: Feb. 22, 2007

(65) Prior Publication Data

US 2007/0201271 A1    Aug. 30, 2007

(30) Foreign Application Priority Data

Feb. 22, 2006    (KR) ...................... 10-2006-0016988

(51) Int. Cl.
*G11C 11/24* (2006.01)
(52) U.S. Cl. ...................................... 365/149; 365/145
(58) Field of Classification Search ................ 365/145, 365/149, 207
See application file for complete search history.

(56) References Cited

U.S. PATENT DOCUMENTS 4,888,732 A * 12/1989 Inoue et al. .................... 365/51
5,917,745 A * 6/1999 Fujii ............................. 365/63
6,333,866 B1 * 12/2001 Ogata .......................... 365/63
6,687,175 B1 * 2/2004 Mizuno et al. .............. 365/203

FOREIGN PATENT DOCUMENTS

KR    1019990029164 A    4/1999

* cited by examiner

*Primary Examiner*—Anh Phung
(74) *Attorney, Agent, or Firm*—Ladas & Parry LLP

(57) ABSTRACT

The present invention relates to a memory device with a hierarchy bit line. In a DRAM with folded bit lines and opened bit lines, it has a hierarchy bit line where bit line signals in two or more columns commonly share one global bit line signal. In the hierarchy bit line, cell array blocks with the folded bit lines transferred with cell data of DRAM cells are arranged between a pair of global bit lines in two or more columns, each of sense amps is arranged on the upper and lower edges of each of the cell array blocks, each of the sense amps is shared in the folded bit lines of the top cell array block and the folded bit lines of the bottom cell array block while being alternatively arranged in the neighboring columns, and the sense amps share the pair of global bit lines. The present invention has an effect of providing a cell array structure effectively adapted to construct an ECC circuit because it has a hierarchy construction where bit line signals in two columns or four columns commonly share one global bit line signals.

10 Claims, 9 Drawing Sheets

MEMORY DEVICE WITH HIERARCHY BIT LINE

TECHNICAL FIELD

The present invention relates to a memory device with a hierarchy bit line.

BACKGROUND ART

As a cell size is small, cell array capacity is increased, and operation voltage is low, the possibility of fail in the cell is increased. The cell defect is caused by physical damage, impurity migration, write fatigue, and electrical signal fluctuation, and the like. A need exists for an Error Checking and Correcting (ECC) circuit in order to relieve such defects.

In a conventional cell array structure, there has been consumed many spaces for constructing the circuit. Therefore, it is difficult to effectively construct the ECC circuit in the conventional cell array structure. Consequently, there has been demanded a development of a new cell array structure capable of effectively constructing the ECC circuit.

DISCLOSURE OF THE INVENTION

In order to solve the problems, it is an object of the present invention to provide a cell array structure capable of effectively constructing an ECC circuit.

It is another object of the present invention to provide a hierarchy bit line where bit line signals in two columns or four columns are shared in one global bit line signal.

In order to accomplish the objects, it is preferable that a DRAM with folded bit lines of the present invention has a hierarchy bit line where bit line signals in two or more columns commonly share one global bit line signal.

Further, it is preferable that the present invention has a hierarchy bit line where bit line signals in two or more columns commonly share one global bit line signal.

More specifically, a semiconductor device with the hierarchy bit line according to the present invention is characterized in that cell array blocks with the folded bit lines transferred with cell data of DRAM cells are arranged between a pair of global bit lines in two or more columns, each of sense amps is arranged on the upper and lower edges of each of the cell array blocks, each of the sense amps is shared in the folded bit lines of the top cell array block and the folded bit lines of the bottom cell array block while being alternatively arranged in the neighboring columns, and the sense amps share the pair of global bit lines.

And, a semiconductor device with the hierarchy bit line according to the present invention is characterized in that cell array blocks with the opened bit lines transferred with cell data of DRAM cells are arranged between a pair of global bit lines in two or more columns, each of sense amps is arranged on the upper and lower edges of each of the cell array blocks, each of the sense amps is shared in the folded bit lines of the top cell array block and the folded bit lines of the bottom cell array block while being alternatively arranged in the neighboring columns, and the sense amps share the pair of global bit lines.

Herein, the sense amps can be applied with different column select signals.

And, a pair of the sense amps each arranged in the two columns can share the pair of global bit lines.

And, four columns are formed between the pair of global bit lines, and the sense amps can share the pair of global bit lines while being alternatively arranged in the neighboring columns.

And, the four sense amps each arranged in the four columns can share the pair of global bit lines.

BEST MODE FOR CARRYING OUT THE INVENTION

Hereinafter, the embodiments of the present invention will be described in more detail with reference to the attached drawings.

Figure 1:
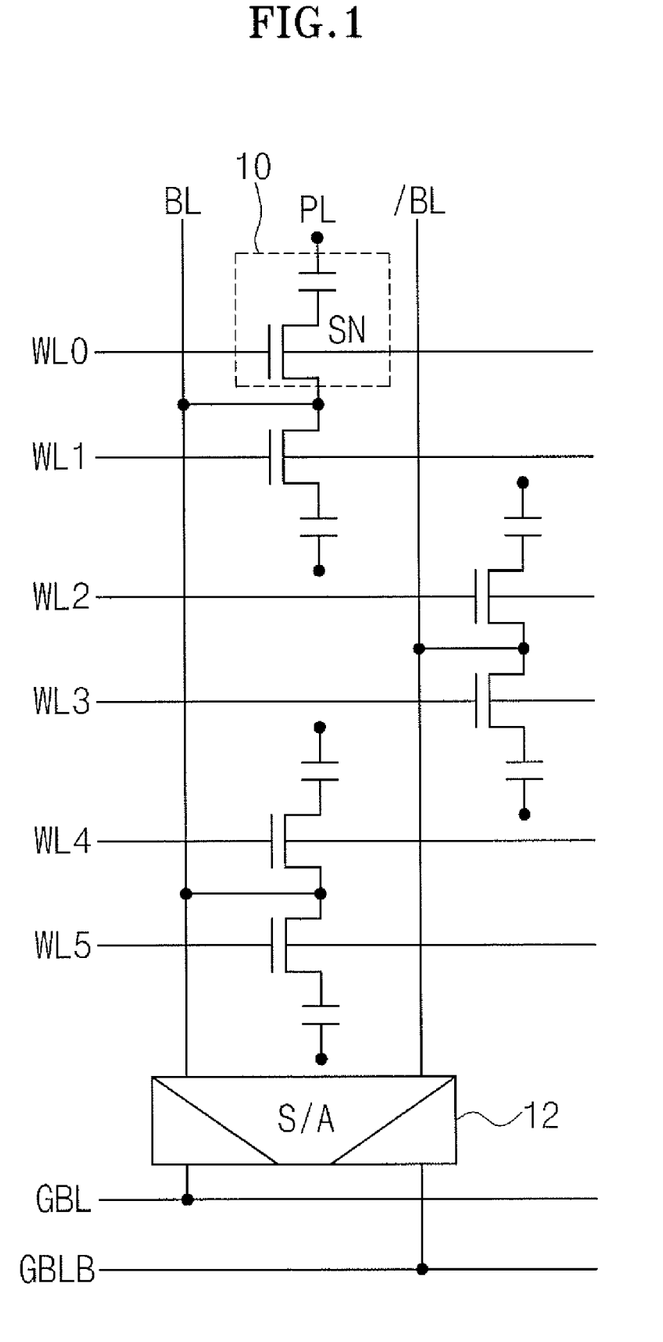
FIG. 1 is a circuit diagram with respect to a cell array and a sense amp with folded bit lines according to the present invention.

Referring to FIG. 1, a cell array constructed in folded bit lines is shown. A DRAM cell 10 is constructed of one capacitor and one NMOS transistor adjusted by a word line WL.

In the DRAM cell 10, a drain terminal of the NMOS transistor is connected to a bit line BL and a source terminal thereof is connected to one electrode of the capacitor. The source terminal of the NMOS transistor connected to the capacitor is defined as a storage node stored with written charge.

The other electrode PL of the capacitor is connected to a common cell plate and is applied with cell plate voltage VCP. The cell plate voltage VCP is a half VDD voltage and the VDD voltage is defined as operation voltage of a high level of cell.

Both output terminals of a latch type sense amp 12 (S/A) are connected to the folded bit lines, that is, bit lines BL and /BL. If a word line WL0 is activated to transfer the cell data to the bit line BL, the bit line /BL is supplied with reference voltage. The data input and output of the sense amp 12 are made by global lines GBL and GBLB.

Figure 2:
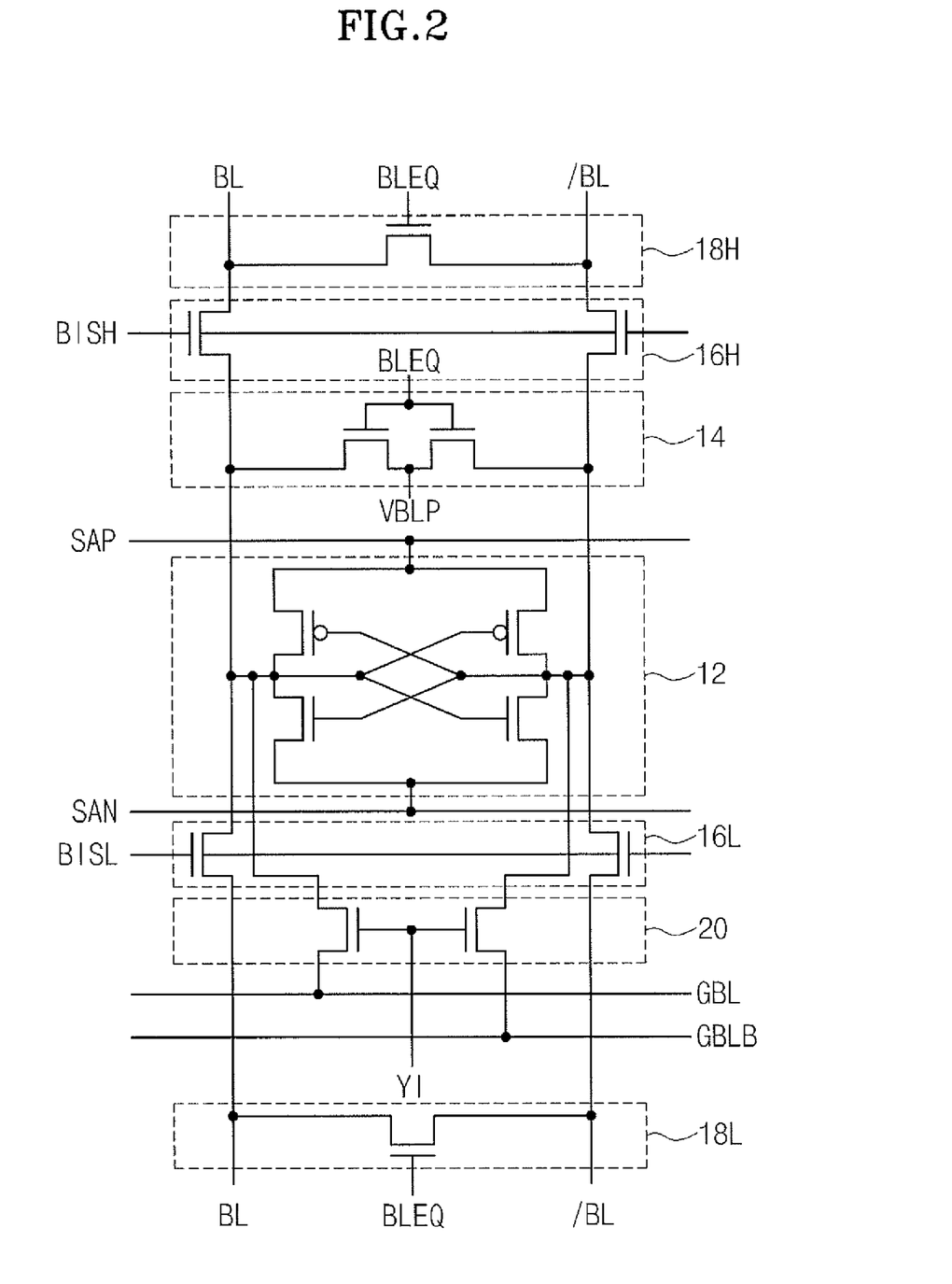
FIG. 2 is a block circuit diagram with respect to the sense amp with the folded bit lines according to the present invention.

FIG. 2 is a circuit diagram with respect to the sense amp with the folded bit lines. FIG. 2 is constructed of the latch type sense amp 12, a precharger 14, bit line selectors 16H and 16L, and equalizers 18H and 18L, and a column selector 20.

The sense amp 12 is a latch type. A pull up activation stage is adjusted by a SAP and a pull down activation stage is adjusted by a SAN.

The bit lines BL and /BL are precharged by using the precharger 14 and are supplied with bit line precharge voltage VBLP by using an equalizing signal BLEQ for precharging. Herein, the bit line precharge voltage VBLP is defined as a half VDD.

The sense amp 12 and the data inputs and outputs between the global lines GBL and GBLB are performed by a column select signal Y1 applied to the column selector 20. The data exchange between the sense amp 12 and the bit lines BL and /BL of the cell array is performed by the operation of the bit line selector 16H and 16L, and the bit line selector 16H and 16L are operated by the bit line select signals BISH and BISL. Also, the equalizers 18H and 18L allows the voltage between the bit lines BL and /BL to be identical by using the bit line equalizing signal BLEQ.

Figure 3:
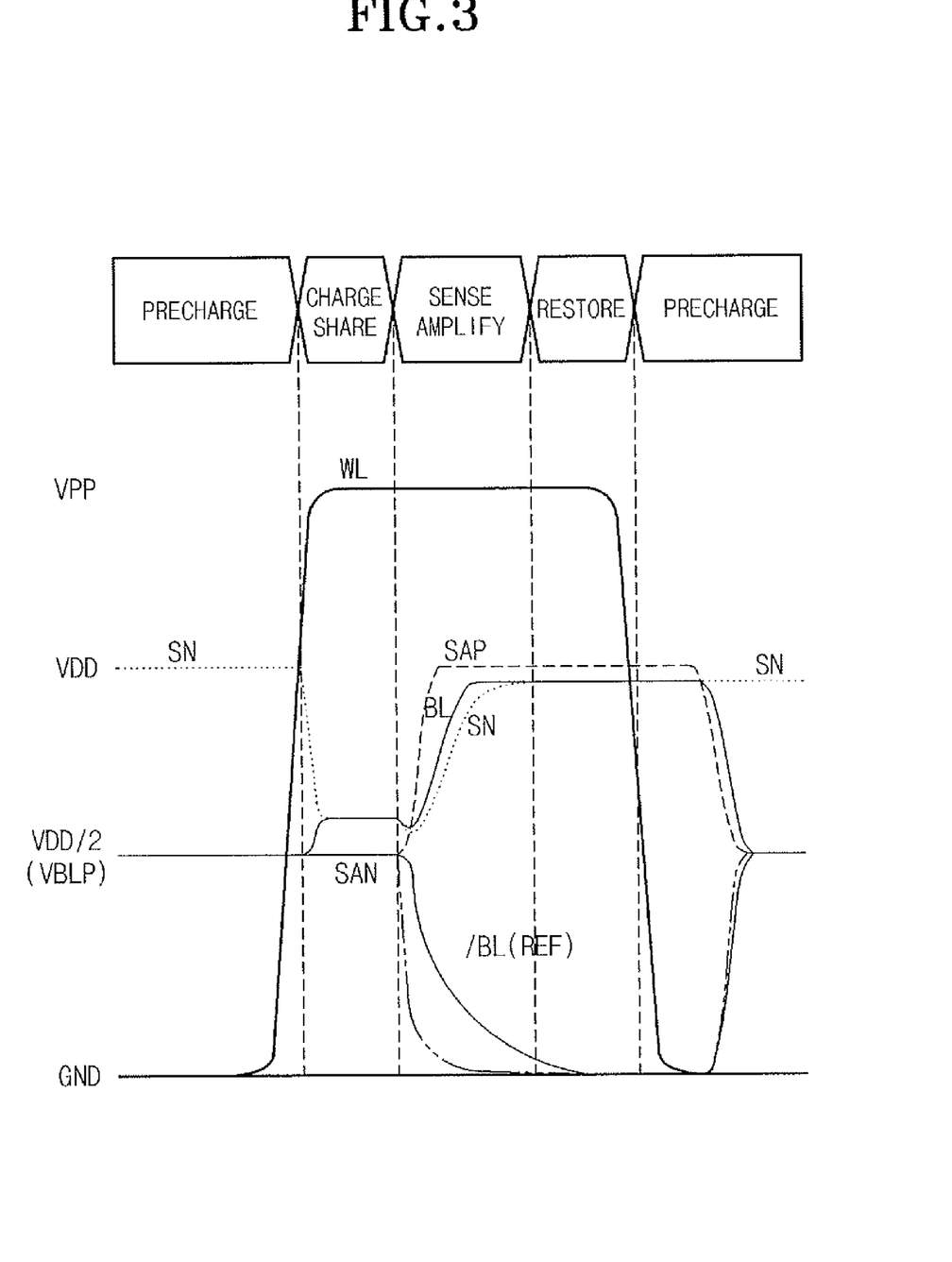
FIG. 3 is a timing chart of operation with respect to a cell array and a sensing.

FIG. 3 is a timing chart of operation with respect to a sense amp with folded bit lines.

Figure 4:
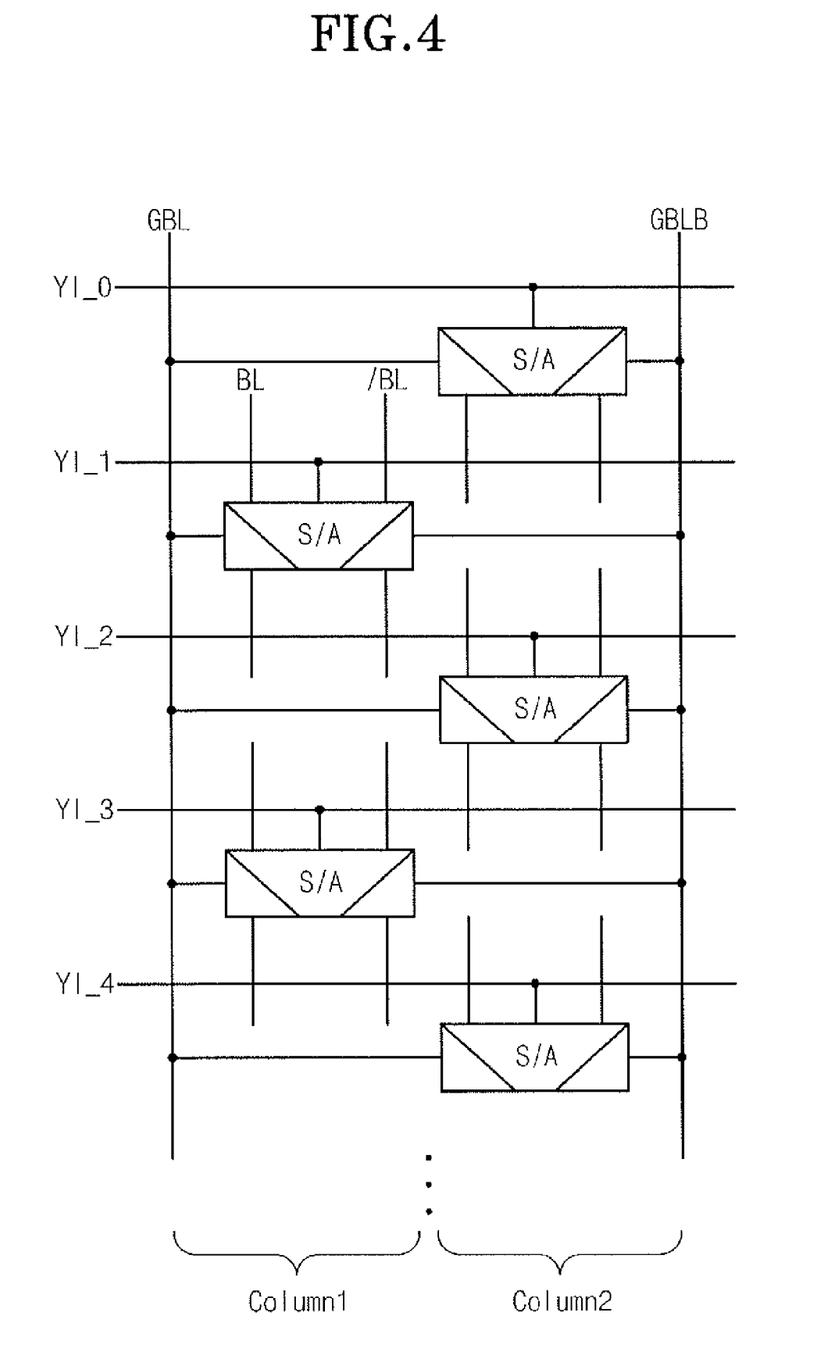
FIG. 4 is a circuit diagram of a memory device with a hierarchy bit line sharing two columns with respect to the folded bit lines, according to a first embodiment of the present invention

Referring to FIG. 4, the BL, /BL, SAN, and SNP are precharged with bit line precharge voltage VBLP in a precharge period. The bit line precharge voltage VBLP is defined as a half VDD of operation voltage VDD that is a high voltage of cell.

The word line WL is activated in a charge share period to carry the data of cell to the bit line BL.

In order to amplify the bit lines BL and /BL signals in a sense amplify period, the SAN is transitioned to the ground voltage and the SAP is transitioned to the operation voltage VDD. Accordingly, the bit lines BL and /BL are amplified to the operation voltage VDD and the ground level.

A restore period is a period to rewrite the amplified signals of the bit lines BL and /BL into the cell, instead. If the restore operation completes, the bit lines BL and /BL returns back into the precharge state.

FIG. 4 is a circuit diagram of a memory device with a hierarchy bit line sharing two columns with respect to the folded bit lines, according to a first embodiment of the present invention.

Referring to FIG. 4, the bit lines BL and /BL of the top cell array block and the bit lines BL and /BL of the bottom cell array block have a constitution using the common sense amps (S/A).

Each of the sense amps is arranged on the upper and lower edge parts of the cell array block, respectively. The number of the sense amps on the one edge part of the cell array corresponds to a half of the number of the columns constructed of the bit lines BL and /BL.

The inputs and outputs of the two sense amps in the two columns are connected to the one global bit lines GBL and GBLB. The connection between the global bit lines GBL and GBLB and the sense amps (S/A) is controlled by the column select signal YI-n in question. And, the inputs and outputs of the bit lines BL and /BL in the two columns are connected to the one global bit lines GBL and GBLB.

Which the inputs and outputs of any sense amps are connected to the global bit lines GBL and GBLB is determined by the column select signal YI-n that is a Y decoding signal. Accordingly, the bit line signals in the two columns become a hierarchy bit line construction commonly sharing the one global bit line signal.

Figure 5:
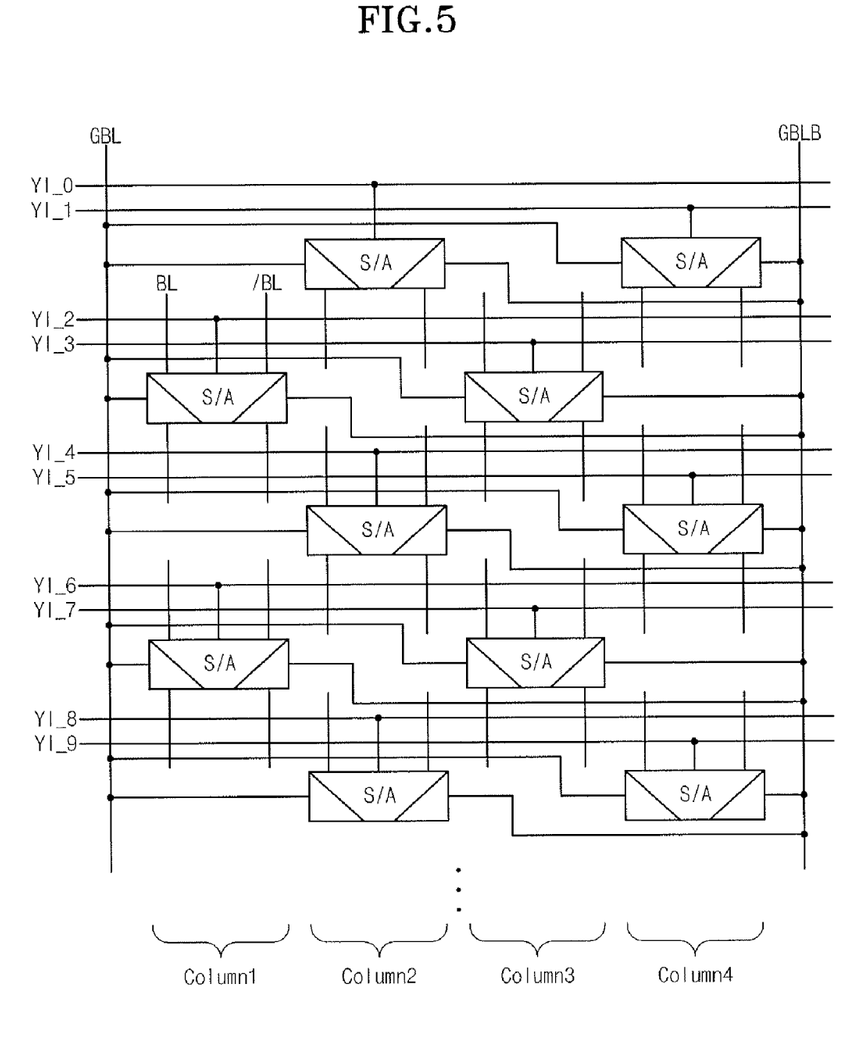
FIG. 5 is a circuit diagram of a memory device with a hierarchy bit line sharing four columns with respect to the folded bit lines, according to a second embodiment of the present invention.

FIG. 5 is a circuit diagram of a memory device with a hierarchy bit line sharing four columns with respect to the folded bit lines, according to a second embodiment of the present invention.

Referring to FIG. 5, the bit lines BL and /BL of the top cell array block and the bit lines BL and /BL of the bottom cell array block have a constitution using the common sense amps (S/A).

Each of the sense amps is arranged on the upper and lower edge parts of the cell array block, respectively. The number of the sense amps on the one edge part of the cell array corresponds to a half of the number of the columns constructed of the bit lines BL and /BL.

The inputs and outputs of the four sense amps in the four columns are connected to the one global bit lines GBL and GBLB. The connection between the global bit lines GBL and GBLB and the sense amps (S/A) is controlled by the column select signal YI-n in question. And, the inputs and outputs of the bit lines BL and /BL in the two columns are connected to the one global bit lines GBL and GBLB.

Which the inputs and outputs of any sense amps are connected to the global bit lines GBL and GBLB is determined by the column select signal YI-n that is a Y decoding signal. Accordingly, the bit line signal in the four columns becomes a hierarchy bit line construction commonly sharing the one global bit line signal.

Figure 6:
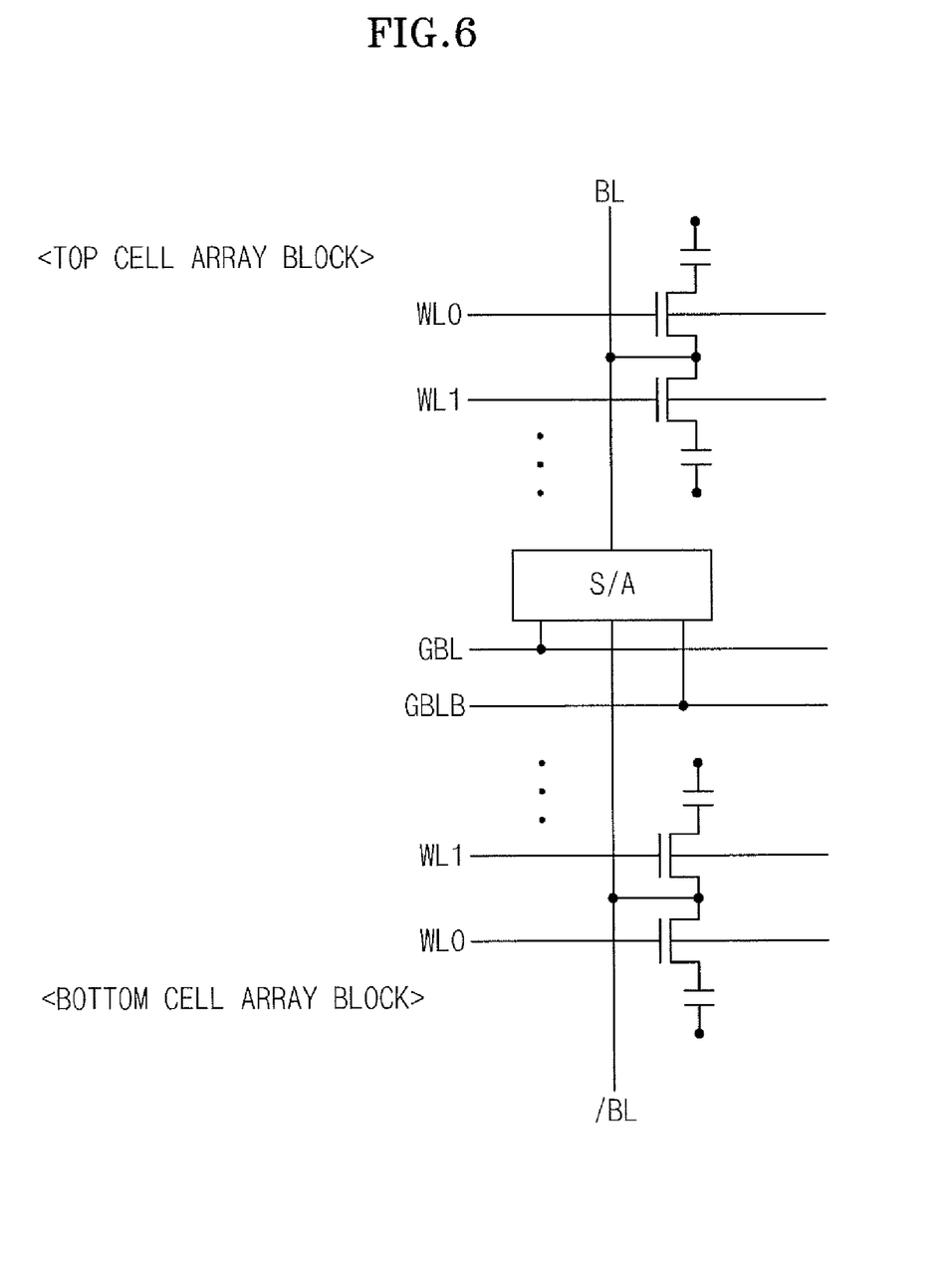
FIG. 6 is a circuit diagram with respect to a cell array and a sense amp with opened bit lines according to the present invention.

FIG. 6 is a circuit diagram with respect to an opened bit line cell array and a sense amp according to the present invention.

Figure 7:
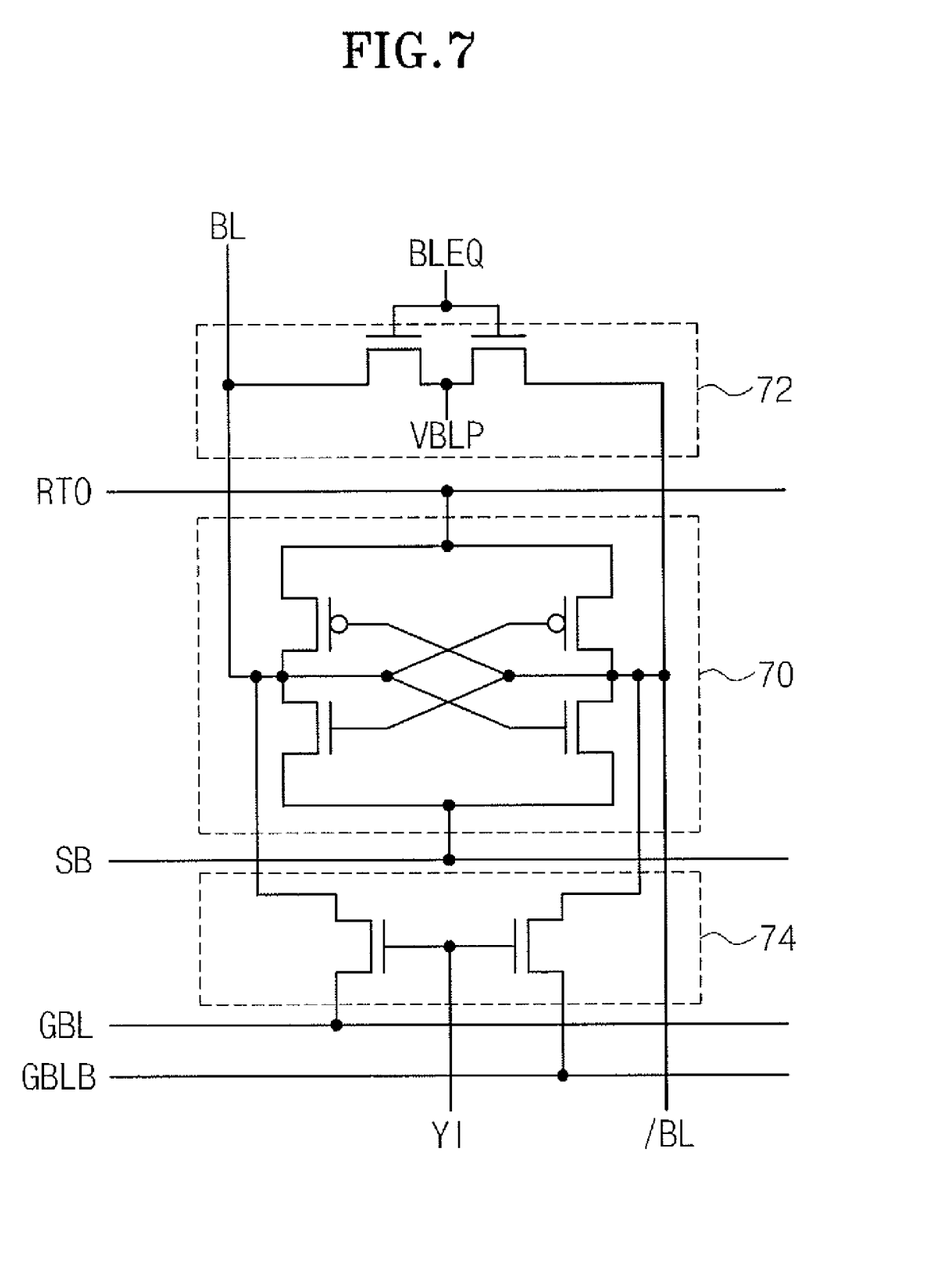
FIG. 7 is a circuit diagram of a sense amp with the opened bit lines according to the present invention.

FIG. 7 is a circuit diagram of an opened bit line sense amp to which the present invention is applied. The structure diagram of the opened bit lines of FIGS. 6 and 7 are can be applied to the present invention as in FIG. 8.

Figure 8:
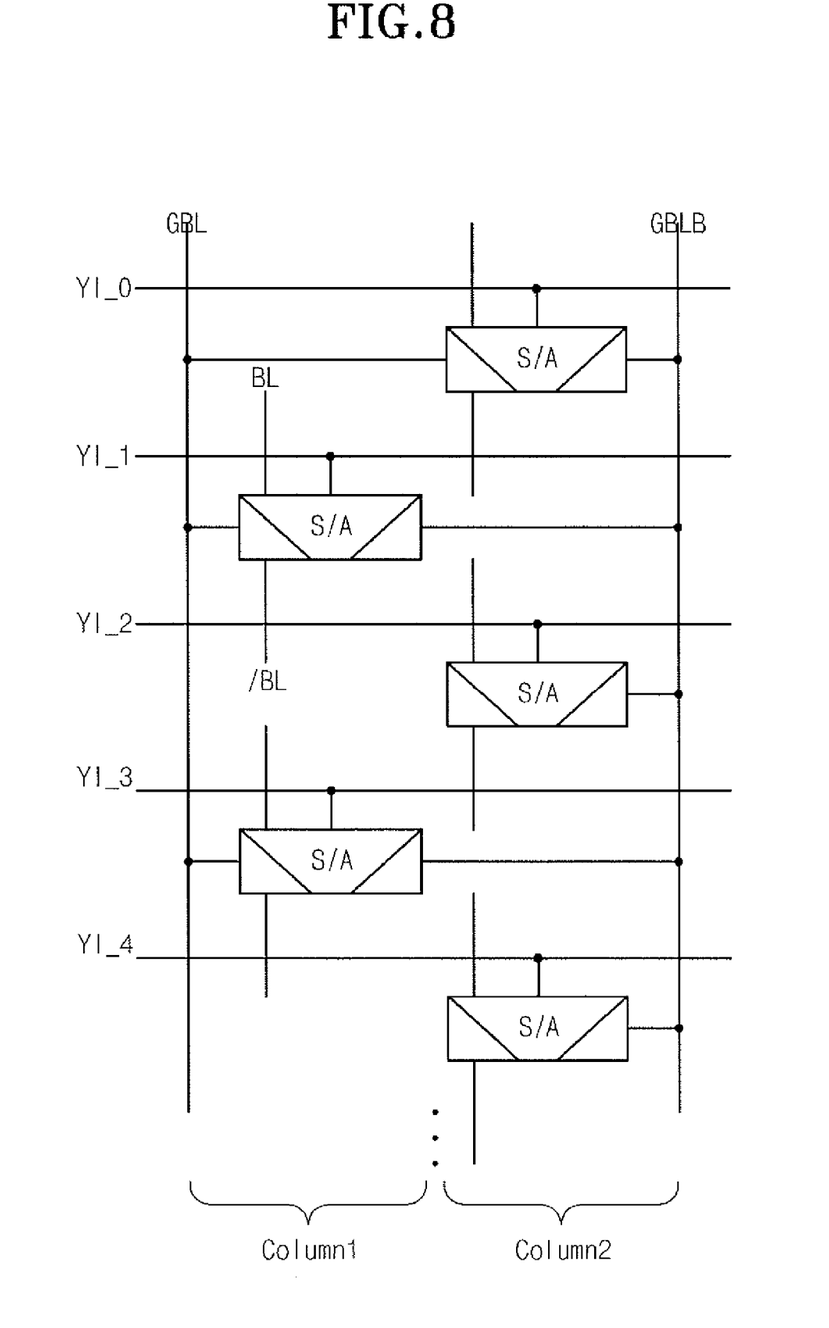
FIG. 8 is a circuit diagram of a memory device with a hierarchy bit line sharing two columns with respect to the opened bit lines, according to a third embodiment of the present invention.

FIG. 8 is a circuit diagram of a memory device with a hierarchy bit line sharing two columns with respect to the opened bit lines, according to a third embodiment of the present invention.

Referring to FIG. 8, the bit line BL of the top cell array block and the bit line /BL of the bottom cell array block have a constitution using the common sense amps (S/A).

Each of the sense amps (S/A) is arranged on the upper and lower edge parts of the cell array block, respectively. The number of the sense amps on the one edge part of the cell array corresponds to a half of the number of the columns constructed of the bit lines BL and /BL.

The inputs and outputs of the two sense amps in the two columns are connected to the one global bit lines GBL and GBLB. The connection between the global bit lines GBL and GBLB and the sense amps (S/A) is controlled by the column select signal YI-n in question. And, the inputs and outputs of the bit lines BL and /BL in the two columns are connected to the one global bit lines GBL and GBLB.

Which the inputs and outputs of any sense amps are connected to the global bit lines GBL and GBLB is determined by the column select signal YI-n that is a Y decoding signal. Accordingly, the bit line signals in the two columns become a hierarchy bit line construction commonly sharing the one global bit line signal.

Figure 9:
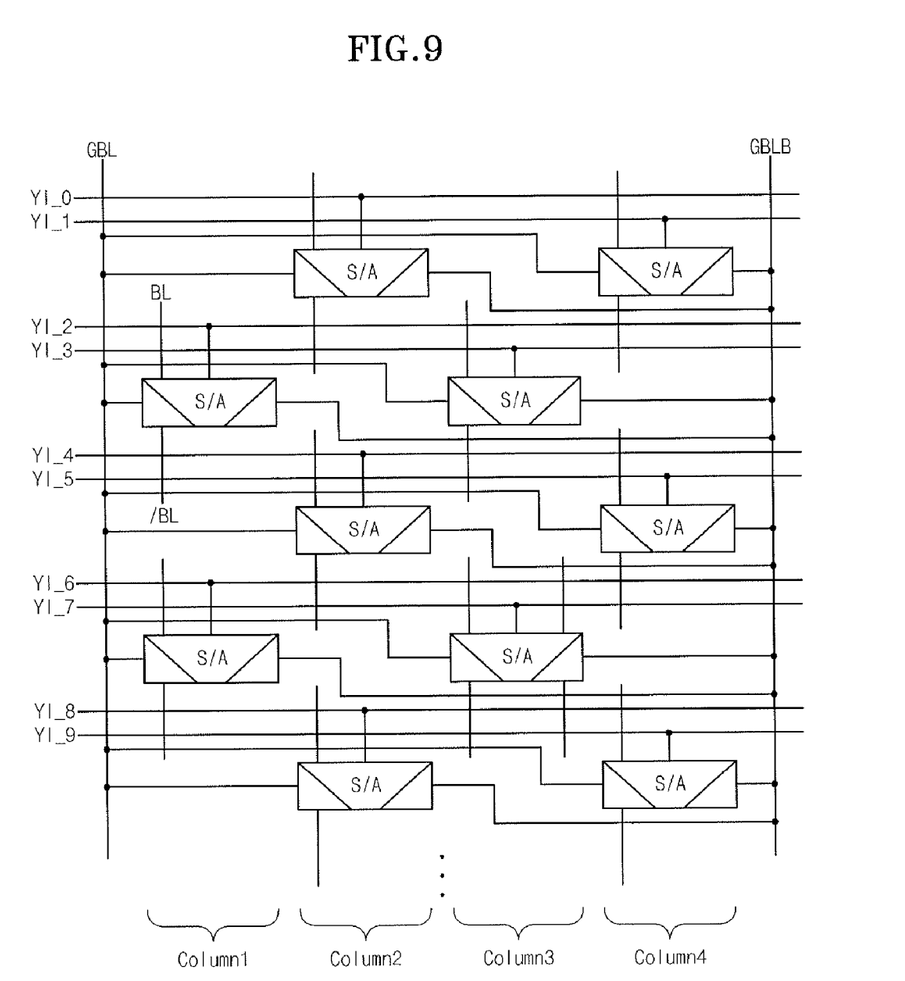
FIG. 9 is a circuit diagram of a memory device with a hierarchy bit line sharing four columns with respect to the opened bit lines, according to a fourth embodiment of the present invention.

FIG. 9 is a circuit diagram of a memory device with a hierarchy bit line sharing four columns with respect to the opened bit lines, according to a fourth embodiment of the present invention.

Referring to FIG. 9, the bit line BL of the top cell array block and the bit line /BL of the bottom cell array block have a constitution using the common sense amps (S/A).

Each of the sense amps is arranged on the upper and lower edge parts of the cell array block, respectively. The number of the sense amps on the one edge part of the cell array corresponds to a half of the number of the columns constructed of the bit lines BL and /BL.

The inputs and outputs of the four sense amps in the four columns are connected to the one global bit lines GBL and GBLB. The connection between the global bit lines GBL and GBLB and the sense amps (S/A) is controlled by the column select signal YI-n in question. And, the inputs and outputs of the bit lines BL and /BL in the two columns are connected to the one global bit lines GBL and GBLB.

Which the inputs and outputs of any sense amps are connected to the global bit lines GBL and GBLB is determined by the column select signal YI-n that is a Y decoding signal. Accordingly, the bit line signals in the four columns become a hierarchy bit line construction commonly sharing the one global bit line signal.

INDUSTRIAL APPLICABILITY

As described above, the present invention has an effect of providing a cell array structure effectively adapted to construct an ECC circuit because it has a hierarchy construction where bit line signals in two columns or four columns commonly share one global bit line signals.

Also, the preferred embodiments of the present invention are disclosed only by way of example. It will be appreciated that those skilled in the art, on consideration of this disclosure, may make modifications and improvements within the spirit and scope of the present invention.

The invention claimed is:

1. A semiconductor device with the hierarchy bit line is characterized in that:
   cell array blocks with the folded bit lines transferred with cell data of DRAM cells are arranged between a pair of global bit lines in two or more columns, each of sense amps is arranged on the upper and lower edges of each of the cell array blocks, each of the sense amps is shared in the folded bit lines of the top cell array block and the folded bit lines of the bottom cell array block while being alternatively arranged in the neighboring columns, and the sense amps share the pair of global bit lines.

2. The semiconductor device with the hierarchy bit line as set forth in claim 1, wherein the sense amps can be applied with different column select signals.

3. The semiconductor device with the hierarchy bit line as set forth in claim 1, wherein a pair of the sense amps each arranged in the two columns can share the pair of global bit lines.

4. The semiconductor device with the hierarchy bit line as set forth in claim 1, four columns are formed between the pair of global bit lines, and the sense amps can share the pair of global bit lines while being alternatively arranged in the neighboring columns.

5. The semiconductor device with the hierarchy bit line as set forth in claim 1, wherein the four sense amps each arranged in the four columns can share the pair of global bit lines.

6. A semiconductor device with the hierarchy bit line, is characterized in that:
   cell array blocks with the opened bit lines transferred with cell data of DRAM cells are arranged between a pair of global bit lines in two or more columns, each of sense amps is arranged on the upper and lower edges of each of the cell array blocks, each of the sense amps is shared in the folded bit lines of the top cell array block and the folded bit lines of the bottom cell array block while being alternatively arranged in the neighboring columns, and the sense amps share the pair of global bit lines.

7. The semiconductor device with the hierarchy bit line as set forth in claim 6, wherein the sense amps can be applied with different column select signals.

8. The semiconductor device with the hierarchy bit line as set forth in claim 6, wherein a pair of the sense amps each arranged in the two columns can share the pair of global bit lines.

9. The semiconductor device with the hierarchy bit line as set forth in claim 6, wherein four columns are formed between the pair of global bit lines, and the sense amps can share the pair of global bit lines while being alternatively arranged in the neighboring columns.

10. The semiconductor device with the hierarchy bit line as set forth in claim 6, wherein the four sense amps each arranged in the four columns can share the pair of global bit lines.

* * * * *